United States Patent [19]

Kamigaito et al.

[11] Patent Number: 4,678,678
[45] Date of Patent: Jul. 7, 1987

[54] METHOD OF STRENGTHENING CERAMICS

[75] Inventors: Osami Kamigaito; Haruo Doi; Shoji Noda; Tatsumi Hioki; Akio Itoh; Mitsutaka Kakeno; all of Aichi, Japan

[73] Assignee: Kabushiki Kaisha Toyota Chuo Kenkyusho, Aichi, Japan

[21] Appl. No.: 694,759

[22] Filed: Jan. 25, 1985

[30] Foreign Application Priority Data

Feb. 22, 1984 [JP] Japan .................................. 59-31880

[51] Int. Cl.$^4$ .............................................. B05D 3/06
[52] U.S. Cl. ..................................... 427/38; 427/250; 427/383.5
[58] Field of Search ....................... 427/38, 250, 383.5

[56] References Cited

U.S. PATENT DOCUMENTS 4,526,624  7/1985  Tombrello et al. ............... 427/38 X
4,526,859  7/1985  Christensen et al. ............. 427/38 X
4,532,149  7/1985  McHargue .......................... 427/38

FOREIGN PATENT DOCUMENTS 0010971  5/1980  European Pat. Off. .
1598814  1/1981  United Kingdom .
2073254  3/1981  United Kingdom .

OTHER PUBLICATIONS

Patent Abstracts of Japan, vol. 8, No. 106, 1984, JP-A-59-20465 Sintered Hard Alloy Tool and Its Production.

Primary Examiner—Bernard D. Pianalto
Attorney, Agent, or Firm—Oblon, Fisher, Spivak, McClelland & Maier

[57] ABSTRACT

A method of strengthening ceramic material by forming a metal film on the surface of the ceramic material and irradiating ions of high energy on the surface of the film. For further improvement, the material may be heat treated at a temperature of 600° C. to 1600° C. after the ion irradiation.

11 Claims, 1 Drawing Figure

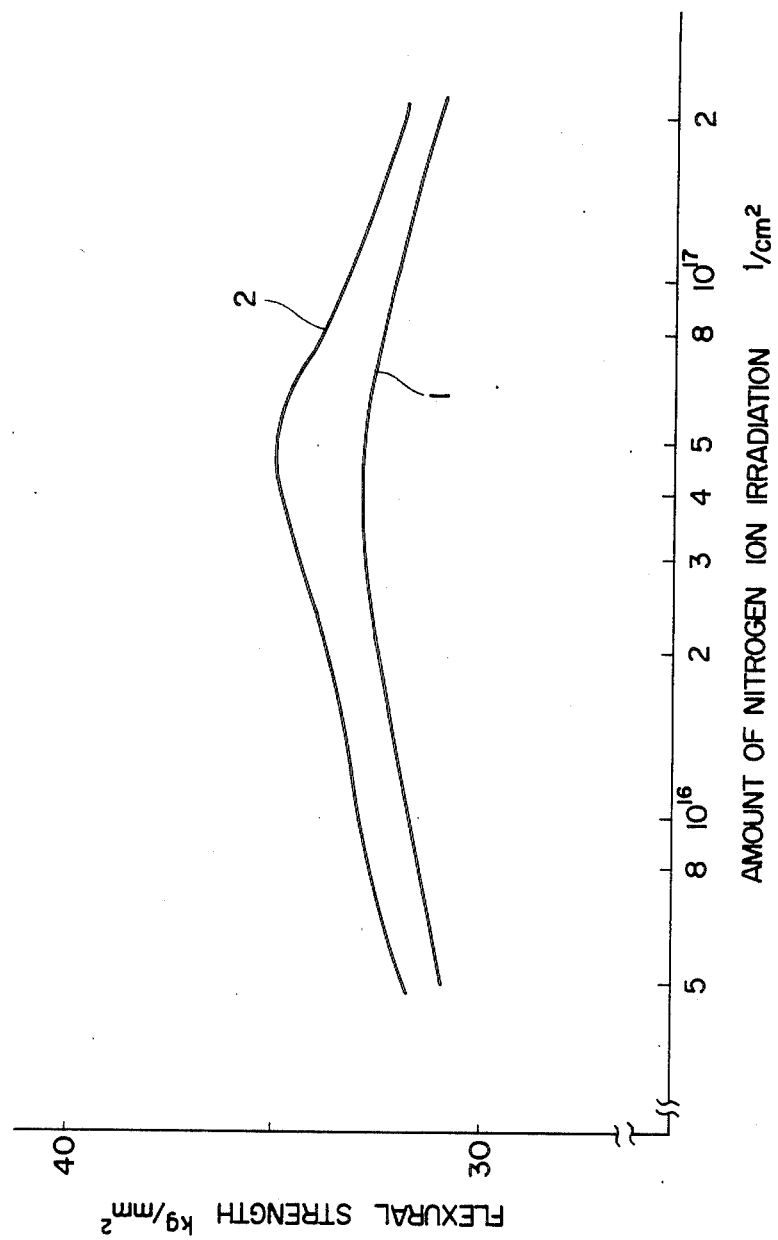

METHOD OF STRENGTHENING CERAMICS

BACKGROUND OF THE INVENTION

1. Field of the Invention

This invention relates to a method of strengthening a ceramic material by forming a metal film on its surface and irradiating ions of high energy thereon.

2. Description of the Prior Art

Ceramics, such as silicon nitride, have been expected to be good structural materials, but have not yet been widely used. This is partly due to the fact that they have a relatively large scattering in mechanical strength. Various attempts, including improvements in the powder to be sintered, sintering additives and the sintering process, have been made to solve the problem. These attempts have, however, not been quite successful, through they have been contributing to reducing the scattering in mechanical strength to some extent.

Fine cracks or like defects which are present in ceramics, especially on their surfaces, are believed to be one of the causes of their scattering in mechanical strength. The action of a critical stress on the fine defects results in their propagation to the interior of the material and eventually its destruction.

SUMMARY OF THE INVENTION

The inventors of this invention have made extensive research on the assumption that the provision of a metal film on the surface of a ceramic material and the irradiation of high energy ions on the film will modify the surface of the material, lower its defect sensitivity and thereby improve the strength of the material.

Accordingly, it is an object of this invention to provide a method of improving the strength of ceramics.

According to this invention, there is provided a method of strengthening a ceramic material which comprises forming a metal film on the surface of the ceramic material and irradiating ions of high energy on the surface of the film. The irradiation of ions of high energy improves the mechanical strength of the ceramic material.

Further, this method may comprise a step of heat treating of the material after irradiation of the ions, whereby the mechanical strength of the material is still more increased.

BRIEF DESCRIPTION OF THE DRAWING

The FIGURE is a graphical representation of the results of the examples of this invention.

DETAILED DESCRIPTION

The invention will hereinafter be described in further detail.

This invention is applicable to conventionally known ceramics, typically oxide ceramics, such as aluminum oxide ($Al_2O_3$) and zirconia ($ZrO_2$) and nonoxide ceramics, such as silicon nitride ($Si_3N_4$) and silicon carbide (SiC). The invention is applicable to a product obtained by sintering the powder of any such ceramic material to a desired shape. The sintered product may contain a sintering assistant, such as yttrium oxide, and other additives. The sintered product may be produced by any method, such as atmospheric pressure sintering or hot pressing.

The method of this invention includes the step of forming a metal film on the surface of the ceramic product. The film may be formed on the whole surface of the product, or only on a portion which is subjected to a substantially concentrated tensile stress when the product is used. The film may be formed from any metal. In order to ensure better results from this invention, however, it is preferable to use, for example, aluminum (Al), silicon (Si), chromium (Cr), a metal of Group IVa, i.e. titamium (Ti), zirconium (Zr) or hafnium (Hf), or a metal of Group Va, i.e. vanadium (V), niobium (Nb) or tantalum (Ta).

It is undesirable to form a film of iron (Fe), cobalt (Co) or nickel (Ni) on a ceramic material such as $Si_3N_4$ and SiC which will be used at a high temperature, since the material is decomposed by the metal if it is heated to a temperature exceeding about 900° C. Any of these metals can be used with any other metal on a ceramic material such as $Si_3N_4$ and SiC which will be used at a temperature not exceeding about 900° C.

The metal film may be formed on the ceramic surface by physical vapor deposition (PVD), such as thermal deposition, sputtering or ionic plating, or by chemical vapor deposition (CVD). It is advisable to clean the ceramic surface by, for example, washing it with acetone before forming the film thereon. Although the thickness of the film to be formed may generally depend on the energy of ions to be irradiated, it is practically advisable to consider a thickness in the range of 500 angstroms (Å) to 2 µm. A uniform film having a smaller thickness is difficult to form, while a film having a larger thickness requires a lot of time for its formation and the irradiation of ions having unduly high energy. The film is usually not strongly bonded to the ceramic material. Care should, therefore, be taken for its handling so that the film may not be scratched off from the ceramic material.

Ions of high energy are, then, irradiated on the ceramic material through the film. Ions of any substance may be used if they can be accelerated easily in an electric field. Ions of a substance which is gaseous at ambient temperature are, however, preferred, as they are easy to irradiate. Specifically, it is possible to use ions of, for example, helium (He), nitrogen (N), argon (Ar) or xenon (Xe).

A plasma is formed from any of such gases and the resulting ions are released into an electrical field for acceleration. The acceleration of ions can be carried out by, for example, a Cockcroft-Walton, van de Graaff or linear accelerator or a cyclotron. The ions are preferably irradiated so as to reach approximately the boundary between the film and the ceramic material, or a point slightly inside of the ceramic material. Such irradiation can be achieved by ions having an energy of, say, 1 KeV to 3 MeV. It is appropriate to irradiate $1 \times 10^{14}$ to $1 \times 10^{18}$ ions per square centimeter. If more ions are irradiated, no correspondingly better result can be obtained, while the irradiation of less ions is ineffective.

The irradiation of ions bonds the film to the ceramic material so strongly that it may not be peeled off even if it is scratched by a diamond stylus.

The accompanying drawing is illustrative of the results of this invention. A silicon film having a thickness of 5000 Å was formed on sintered $Al_2O_3$ by electron beam deposition, and nitrogen ions having an accelerated energy of 250 KeV were irradiated on the film. Different amounts of ions were irradiated and differences in the flexural strength of the ceramic material were examined. The results are shown by curve 1.

The flexural strength tests were conducted by the application of a load which would cause the tensile stress on the film. The flexural strength was the tensile flexural stress calculated from the load which had caused the fracture of the ceramic material. As is obvious from the drawing, the irradiation of ions increased the flexural strength of the ceramic material until the amount of the irradiated ions reached a certain level at which the flexural strength of the ceramic material showed a peak and began to decrease. The reason for this improvement in the ceramic strength is not clear, but the following assumption would probably be correct. The ions of high energy irradiated on the metal film force the metal into the ceramic material and forms a modified ceramic layer which is composed of a mixture of ceramic material, metal and ions. This layer is considered to remove the defects in the ceramic material. Moreover, the modified layer is sometimes likely to develop a residual compressive stress due to an increase in volume. This residual stress is considered to enable the ceramic material to withstand a greater load when a tensile stress acts on its surface. These and other factors are believed to contribute to lowering the fracture sensitivity of the ceramic material.

As mentioned above, it is, thus, possible to improve the strength of a ceramic material by lowering its fracture sensitivity.

A further improvement of the strength of a ceramic material is achieved by the heat treatment of the material after the irradiation of high energy ions. This treatment may be carried out by an ordinary heating furnace. It is, however, necessary to employ in the furnace an atmosphere which does not cause the decomposition of the ceramic material. It is preferable to use a nitrogen or other inert gas atmosphere or a vacuum atmosphere for heating nonoxide ceramics, such as $Si_3N_4$ or SiC. It is advisable to use a heating temperature which is lower than the melting point of the metal forming the film, and which is in the range of 600° C. to 1600° C. Although the heating time may depend on the kinds of the ceramic material and the ions employed, it is advisable to use a period of 0.5 to five hours in order to obtain satisfactory results. The use of any longer heating time is not practical, since it is not expected to realize any further improvement in the strength of the ceramic material.

The ceramics which had showed the results expressed by curve 1 were heated at 1000° C. for two hours in a nitrogen atmosphere and tested for flexural strength. The results are shown by curve 2 in the drawing (see EXAMPLE 1). As is obvious from the results, the heat treatment of the ceramics after ion irradiation improves their strength to a further extent.

The heat treatment enables a further improvement in the strength of ceramics over the results obtained from the first mentioned method. It also improves the bonding strength between the film and the ceramic material.

The invention will now be described with reference to a number of examples thereof.

EXAMPLE 1

Pieces having a width of 4 mm, a thickness of 3 mm and a length of 40 mm were formed from sintered $Al_2O_3$ and their surfaces were polished by #600 emery paper to prepare testpieces for a flexural strength test according to JIS. A silicon film having a thickness of 5000 Å was formed on the surface of each testpiece by vapor deposition. Then, nitrogen ions having an accelerated energy of 250 KeV were irradiated on one side of each testpiece. The ions were irradiated in six different doses, i.e. $5 \times 10^{15}$, $1 \times 10^{16}$, $2 \times 10^{16}$, $5 \times 10^{16}$, $1 \times 10^{17}$ and $2 \times 10^{17}$ ions per square centimeter to prepare ceramic samples according to the method comprising forming a metal film and irradiating ions rhereon.

Another set of testpieces were likewise prepared, and heated at 1000° C. for two hours in a nitrogen atmosphere to prepare ceramic samples according to the method further comprising a step of heat treating.

Then, each testpiece was supported over a span of 30 mm and subjected to a flexural strength test conducted by applying a load to its center and bending it at four points. The testpiece was supported in a position allowing its ion irradiated side to be stretched during the flexural strength test. A testpiece on which a silicon film having a thickness of 5000 Å had been formed by vapor deposition was prepared for comparison purposes, and tested for flexural strength in the same way.

The tensile flexural stress of each testpiece was obtained from the load which had caused its fracture as a result of its flexural strength test. This stress was employed to express the flexural strength of each testpiece. In the drawing, the ordinate shows the flexural strength and the abscissa indicates the amount or dose of irradiated ions. The results obtained from the testpiece not subjected to heat treating are shown by curve 1, and the results of the testpiece subjected to heat treating by curve 2. The flexural strength of the testpiece on which no ion was irradiated for comparison purposes is shown by a black dot. As is obvious from these results, the irradiation of ions improves the strength of sintered $Al_2O_3$ and its heat treatment improves its strength to a further extent.

EXAMPLE 2

Testpieces of the same size and shape as those employed in EXAMPLE 1 were formed from $Al_2O_3$, $ZrO_2$, $Si_3N_4$ and SiC, and metal films were formed thereon by sputtering from metals shown in TABLES 1 to 8. Argon ions were irradiated on some testpieces by a Cockcroft-Walton accelerator through the metal films, while nitrogen ions were irradiated on other testpieces. Some of the testpieces on which the ions had been irradiated were heat treated.

The metal films had a thickness of 4600 Å on the testpieces on which nitrogen ions were irradiated, and of 2000 Å on those on which argon ions were irradiated. The nitrogen and argon ions were accelerated by the application of a voltage enabling the ions to penetrate exactly through the thickness of the metal film.

The ions were irradiated in the amount of $5 \times 10^{16}$ per square centimeter. The heat treatment of some of the testpieces was performed for two hours at a temperature of 1000° C., 1200° C. or 1400° C. in a nitrogen, argon, vacuum or atmospheric air atmosphere (but in a nitrogen or argon gas atmosphere for $Si_3N_4$ and SiC).

Then, each testpiece was tested for flexural strength in accordance with the method employed in EXAMPLE 1. The results are shown in TABLES 1 to 8. TABLES 1 to 4 show the results obtained on the testpieces on which nitrogen ions were irradiated, and TABLES 5 to 8 show the results on the testpieces on which argon ions were irradiated. Each value of flexural strength is the average obtained from five testpieces. The tables also show the flexural strength of ceramic testpieces on which no metal film was formed for comparison.

As is obvious from the tables, it is possible to improve the flexural strength of any ceramic material by forming a metal film thereon and irradiating nitrogen or argon ions thereon. It is also obvious that the flexural strength is further increased by heat treating.

TABLE 1

| Ceramics | Irradiated ion | Heating atmosphere | | Treating temp. ($\times 100°$ C.) | | | | | | | | | | | | |
|---|---|---|---|---|---|---|---|---|---|---|---|---|---|---|---|---|
| | | | | / | 10 | 12 | 14 | / | 10 | 12 | 14 | / | 10 | 12 | 14 | / | 10 | 12 | 14 |
| | | | | | | | | | Metal element | | | | | | |
| | | | | | Ti | | | | Zr | | | | Hf | | | | V | | |
| Al$_2$O$_3$ (flexural strength 29.5 kg/mm$^2$) | Nitrogen | N$_2$ Vacuum Air | flexural strength (kg/mm$^2$) | 31 — — | 34 38 34 | 34 38 33 | 32 34 34 | 32 — — | 35 39 38 | 36 40 39 | 38 38 36 | 32 — — | 34 36 35 | 36 38 37 | 34 36 35 | 32 — — | 36 38 36 | 38 39 37 | 36 36 34 |
| | | | | | | | | | Metal element | | | | | | |
| | | | | | Nb | | | | Ta | | | | Al | | | | Si | | |
| | | N$_2$ Vacuum Air | flexural strength (kg/mm$^2$) | 34 — — | 40 42 38 | 42 46 42 | 40 40 38 | 32 — — | 36 38 36 | 38 40 38 | 34 36 34 | 32 — — | 38 38 36 | 48 46 44 | 42 40 40 | 32 — — | 35 34 36 | 44 42 45 | 40 38 42 |
| | | | | | | | | | Metal element | | | | | | |
| | | | | | Cr | | | | Fe | | | | Co | | | | Ni | | |
| | | N$_2$ Vacuum Air | flexural strength (kg/mm$^2$) | 31 — — | 36 38 36 | 42 42 44 | 40 41 40 | 31 — — | 38 36 36 | 42 40 38 | 36 34 36 | 32 — — | 38 36 34 | 44 40 38 | 40 38 36 | 32 — — | 38 36 36 | 42 40 38 | 38 36 34 |

TABLE 2

| Ceramics | Irradiated ion | Heating atmosphere | | Treating temp. ($\times 100°$ C.) | | | | | | | | | | | | |
|---|---|---|---|---|---|---|---|---|---|---|---|---|---|---|---|---|
| | | | | / | 10 | 12 | 14 | / | 10 | 12 | 14 | / | 10 | 12 | 14 | / | 10 | 12 | 14 |
| | | | | | | | | | Metal element | | | | | | |
| | | | | | Ti | | | | Zr | | | | Hf | | | | V | | |
| ZrO$_2$ (flexural strength 50.0 kg/mm$^2$) | Nitrogen | N$_2$ Vacuum Air | flexural strength (kg/mm$^2$) | 52 — — | 58 56 57 | 66 64 65 | 62 60 61 | 53 — — | 58 56 56 | 68 66 69 | 63 62 60 | 52 — — | 56 54 55 | 64 62 63 | 62 61 60 | 53 — — | 58 57 58 | 66 65 68 | 63 62 60 |
| | | | | | | | | | Metal element | | | | | | |
| | | | | | Nb | | | | Ta | | | | Al | | | | Si | | |
| | | N$_2$ Vacuum Air | flexural strength (kg/mm$^2$) | 52 — — | 59 58 57 | 64 62 65 | 62 61 63 | 54 — — | 58 56 55 | 62 63 64 | 56 57 60 | 53 — — | 60 58 57 | 68 66 65 | 63 61 60 | 52 — — | 61 58 57 | 69 67 64 | 64 62 60 |
| | | | | | | | | | Metal element | | | | | | |
| | | | | | Cr | | | | Fe | | | | Co | | | | Ni | | |
| | | N$_2$ Vacuum Air | flexural strength (kg/mm$^2$) | 52 — — | 56 54 53 | 62 63 62 | 60 60 58 | 53 — — | 54 56 55 | 63 64 65 | 61 60 58 | 52 — — | 54 53 55 | 65 62 64 | 60 58 60 | 53 — — | 58 56 55 | 66 64 63 | 60 58 61 |

TABLE 3

| Ceramics | Irradiated ion | Heating atmosphere | | Treating temp. ($\times 100°$ C.) | | | | | | | | | | | | |
|---|---|---|---|---|---|---|---|---|---|---|---|---|---|---|---|---|
| | | | | / | 10 | 12 | 14 | / | 10 | 12 | 14 | / | 10 | 12 | 14 | / | 10 | 12 | 14 |
| | | | | | | | | | Metal element | | | | | | |
| | | | | | Ti | | | | Zr | | | | Hf | | | | V | | |
| Si$_3$N$_4$ (flexural strength 60.0 kg/mm$^2$) | Nitrogen | N$_2$ Vacuum Air | flexural strength (kg/mm$^2$) | 64 — — | 72 70 — | 78 76 — | 74 72 — | 65 — — | 73 72 — | 81 80 — | 75 74 — | 66 — — | 72 71 — | 80 79 — | 76 75 — | 64 — — | 72 71 — | 78 77 — | 70 68 — |
| | | | | | | | | | Metal element | | | | | | |
| | | | | | Nb | | | | Ta | | | | Al | | | | Si | | |
| | | N$_2$ Vacuum Air | flexural strength (kg/mm$^2$) | 63 — — | 71 70 — | 77 76 — | 65 64 — | 64 — — | 70 68 — | 76 74 — | 74 72 — | 64 — — | 72 70 — | 78 76 — | 76 72 — | 68 — — | 74 70 — | 80 78 — | 77 74 — |

TABLE 4

| Ceramics | Irradiated ion | Heating atmosphere | | Treating temp. ($\times 100°$ C.) | | | | | | | | | | | | |
|---|---|---|---|---|---|---|---|---|---|---|---|---|---|---|---|---|
| | | | | / | 10 | 12 | 14 | / | 10 | 12 | 14 | / | 10 | 12 | 14 | / | 10 | 12 | 14 |
| | | | | | | | | | Metal element | | | | | | |
| | | | | | Ti | | | | Zr | | | | Hf | | | | V | | |
| SiC (flexural strength 51.0 kg/mm$^2$) | Nitrogen | N$_2$ Vacuum Air | flexural strength (kg/mm$^2$) | 56 — — | 62 60 — | 70 68 — | 68 66 — | 54 — — | 60 58 — | 68 66 — | 66 64 — | 54 — — | 61 60 — | 67 66 — | 65 64 — | 55 — — | 58 56 — | 66 64 — | 62 60 — |
| | | | | | | | | | Metal element | | | | | | |
| | | | | | Nb | | | | Ta | | | | Al | | | | Si | | |
| | | N$_2$ Vacuum | flexural strength | 53 — | 59 58 | 67 64 | 62 58 | 55 — | 60 58 | 66 64 | 64 60 | 56 — | 62 62 | 70 68 | 68 64 | 54 — | 60 58 | 68 66 | 64 62 |

TABLE 4-continued

| Ceramics | Irradiated ion | Heating atmosphere | | Treating temp. (× 100° C.) | | | |
|---|---|---|---|---|---|---|---|
| | | | | / 10 12 14 | / 10 12 14 | / 10 12 14 | / 10 12 14 |
| | | Air | (kg/mm²) | — — — — | — — — — | — — — — | — — — — |

TABLE 5

| Ceramics | Irradiated ion | Heating atmosphere | | Treating temp. (× 100° C.) | | | |
|---|---|---|---|---|---|---|---|
| | | | | / 10 12 14 | / 10 12 14 | / 10 12 14 | / 10 12 14 |
| | | | | Metal element | | | |
| | | | | Ti | Zr | Hf | V |
| $Al_2O_3$ (flexural strength 29.5 kg/mm²) | Argon | $N_2$ Ar Air | flexural strength (kg/mm²) | 32 34 36 32<br>— 32 34 30<br>— 30 35 32 | 31 33 38 32<br>— 34 36 32<br>— 33 37 31 | 32 34 38 32<br>— 33 37 33<br>— 34 39 37 | 31 33 40 36<br>— 34 38 34<br>— 35 39 35 |
| | | | | Metal element | | | |
| | | | | Nb | Ta | Al | Si |
| | | $N_2$ Ar Air | flexural strength (kg/mm²) | 31 34 38 34<br>— 35 40 36<br>— 34 42 34 | 31 36 42 40<br>— 34 38 36<br>— 38 40 38 | 32 36 44 42<br>— 38 46 40<br>— 36 44 38 | 31 35 46 42<br>— 38 44 40<br>— 39 45 38 |
| | | | | Metal element | | | |
| | | | | Cr | Fe | Co | Ni |
| | | $N_2$ Ar Air | flexural strength (kg/mm²) | 32 36 44 42<br>— 38 46 40<br>— 37 43 39 | 32 36 43 40<br>— 38 45 39<br>— 37 43 38 | 31 36 38 40<br>— 34 42 38<br>— 35 40 36 | 32 35 42 40<br>— 36 43 39<br>— 37 44 40 |

TABLE 6

| Ceramics | Irradiated ion | Heating atmosphere | | Treating temp. (× 100° C.) | | | |
|---|---|---|---|---|---|---|---|
| | | | | / 10 12 14 | / 10 12 14 | / 10 12 14 | / 10 12 14 |
| | | | | Metal element | | | |
| | | | | Ti | Zr | Hf | V |
| $ZrO_2$ (flexural strength 50.0 kg/mm²) | Argon | $N_2$ Ar Air | flexural strength (kg/mm²) | 53 58 66 62<br>— 57 65 63<br>— 56 63 60 | 54 58 68 62<br>— 57 69 61<br>— 56 68 63 | 53 57 67 61<br>— 58 65 62<br>— 56 64 60 | 52 59 68 62<br>— 57 65 60<br>— 56 66 61 |
| | | | | Metal element | | | |
| | | | | Nb | Ta | Al | Si |
| | | $N_2$ Ar Air | flexural strength (kg/mm²) | 53 57 67 62<br>— 56 64 61<br>— 57 67 62 | 54 55 64 60<br>— 58 66 62<br>— 57 65 60 | 53 56 66 63<br>— 57 68 63<br>— 56 67 60 | 54 56 65 62<br>— 57 66 62<br>— 55 67 60 |
| | | | | Metal element | | | |
| | | | | Cr | Fe | Co | Ni |
| | | $N_2$ Ar Air | flexural strength (kg/mm²) | 53 54 58 56<br>— 56 60 56<br>— 55 59 54 | 52 54 60 56<br>— 56 62 54<br>— 54 60 56 | 53 55 60 58<br>— 56 61 59<br>— 54 62 58 | 54 56 61 56<br>— 58 62 57<br>— 57 60 56 |

TABLE 7

| Ceramics | Irradiated ion | Heating atmosphere | | Treating temp. (× 100° C.) | | | |
|---|---|---|---|---|---|---|---|
| | | | | / 10 12 14 | / 10 12 14 | / 10 12 14 | / 10 12 14 |
| | | | | Metal element | | | |
| | | | | Ti | Zr | Hf | V |
| $Si_3$ (flexural strength 60.0 kg/mm²) | Argon | $N_2$ Ar Air | flexural strength (kg/mm²) | 62 68 74 72<br>— 66 75 73<br>— — — — | 63 68 72 70<br>— 67 71 68<br>— — — — | 64 69 74 71<br>— 68 72 70<br>— — — — | 63 70 74 68<br>— 70 75 69<br>— — — — |
| | | | | Metal element | | | |
| | | | | Nb | Ta | Al | Si |
| | | $N_2$ Ar Air | flexural strength (kg/mm²) | 64 68 75 67<br>— 68 76 64<br>— — — — | 62 67 73 70<br>— 66 74 72<br>— — — — | 63 68 74 72<br>— 67 73 70<br>— — — — | ·64 67 76 70<br>— 66 75 70<br>— — — — |

TABLE 8

| Ceramics | Irradiated ion | Heating atmosphere | | Treating temp. (× 100° C.) | | | |
|---|---|---|---|---|---|---|---|
| | | | | / 10 12 14 | / 10 12 14 | / 10 12 14 | / 10 12 14 |
| | | | | Metal element | | | |
| | | | | Ti | Zr | Hf | V |
| SiC (flexural strength 51.0 kg/mm²) | Argon | $N_2$ Ar Air | flexural strength (kg/mm²) | 53 60 66 62<br>— 62 68 61<br>— — — — | 54 61 68 63<br>— 62 69 63<br>— — — — | 55 61 67 62<br>— 62 68 64<br>— — — — | 56 62 68 60<br>— 64 69 65<br>— — — — |
| | | | | Metal element | | | |
| | | | | Nb | Ta | Al | Si |

TABLE 8-continued

| Ceramics | Irradiated ion | Heating atmosphere | Treating temp. (× 100° C.) | | | | | | | | | | | | |
|---|---|---|---|---|---|---|---|---|---|---|---|---|---|---|---|
| | | | / | 10 | 12 | 14 | / | 10 | 12 | 14 | / | 10 | 12 | 14 | |
| | N₂ | flexural | 55 | 63 | 69 | 60 | 54 | 64 | 68 | 62 | 55 | 66 | 72 | 68 | 54 66 73 69 |
| | Ar | strength | — | 64 | 72 | 66 | — | 66 | 70 | 64 | — | 64 | 73 | 69 | — 66 72 68 |
| | Air | (kg/mm²) | — | — | — | — | — | — | — | — | — | — | — | — | — — — — |

What is claimed is:

1. A method of strengthening a ceramic material as structural material, comprising forming a metal film on the surface of the ceramic material selected from the group consisting of alumina (Al₂O₃), zirconia (ZrO₂), silicon nitride (Si₃N₄), and silicon carbide (SiC), and irradiating the surface of said metal film with high energy ions of a substance which is gaseous at ambient temperature, said ions having an energy of 1 KeV to 3 MeV, so as to reduce fracture sensitivity.

2. A method of strengthening a ceramic material as structural material, comprising forming a metal film on the surface of the ceramic material selected from the group consisting of alumina (Al₂O₃), zirconia (ZrO₂), silicon nitride (Si₃N₄), and silicon carbide (SiC), and irradiating the surface of said metal film with high energy ions of a substance which is gaseous at ambient temperature, so as to form a modified ceramic layer in the boundary between said ceramic material and said metallic film, which is composed of a mixture of said ceramic material and the metal of said metallic film, said ions having an energy of 1 KeV to 3 MeV, thereby reducing fracture sensitivity.

3. A method according to claim 1, wherein said metal film is formed of at least one of aluminum (Al), silicon (Si), chromium (Cr), elements of Groups IVa and Va, iron (Fe), cobalt (Co) and nickel (Ni).

4. A method according to claim 3, wherein said metal film has a thickness of 500 Å to 2 μm.

5. A method according to claim 4, wherein said metal film is formed by physical vapor deposition.

6. A method according to claim 5, wherein said physical vapor deposition is selected from the group consisting of thermal deposition, sputtering and ionic plating.

7. A method according to claim 4, wherein said metal film is formed by chemical vapor deposition.

8. A method according to claim 3, wherein said ions are selected from the group consisting of helium (He), nitrogen (N), argon (Ar) and Xenon (Xe) ions.

9. A method according to claim 7, wherein said ions are irradiated $1 \times 10^{14}$ to $1 \times 10^{18}$ per square centimeter.

10. A method according to claim 1, further comprising heat treating said ceramic material.

11. A method according to claim 10, wherein said heat treating is carried out at a temperature in the range of 600° C. to 1600° C. and for a period of 0.5 to five hours.

* * * * *